(12) United States Patent
Huber et al.

(10) Patent No.: US 8,022,416 B2
(45) Date of Patent: Sep. 20, 2011

(54) FUNCTIONAL BLOCKS FOR ASSEMBLY

(75) Inventors: William Hullinger Huber, Scotia, NY (US); Ching-Yeu Wei, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1269 days.

(21) Appl. No.: 11/254,096

(22) Filed: Oct. 19, 2005

(65) Prior Publication Data
US 2007/0231949 A1    Oct. 4, 2007

(51) Int. Cl.
*H01L 27/15*    (2006.01)
*H01L 31/12*    (2006.01)
*H01L 31/153*    (2006.01)
*H01L 33/00*    (2006.01)

(52) U.S. Cl. ... 257/84; 257/421; 257/735; 257/E23.005; 257/E29.323

(58) Field of Classification Search ............ 257/84, 257/678, 421, 735, E33.077, E29.323, E21.505, 257/E23.003, E23.005
See application file for complete search history.

(56) References Cited

U.S. PATENT DOCUMENTS

| | | | |
|---|---|---|---|
| 3,439,416 A | 4/1969 | Yando | |
| 4,834,805 A | 5/1989 | Erbert | |
| 5,203,847 A | 4/1993 | Butt | |
| 5,474,060 A | 12/1995 | Evans | |
| 5,574,605 A | 11/1996 | Baumgart et al. | |
| 5,783,856 A | 7/1998 | Smith et al. | |
| 5,932,097 A | 8/1999 | Wilson | |
| 6,080,337 A | 6/2000 | Kambe et al. | |
| 6,303,218 B1 | 10/2001 | Kamiguchi et al. | |
| 6,328,856 B1 | 12/2001 | Brucker | |
| 6,331,364 B1 | 12/2001 | Baglin et al. | |
| 6,337,215 B1 | 1/2002 | Wilson | |
| 6,507,989 B1 | 1/2003 | Bowden et al. | |
| 6,555,252 B2 | 4/2003 | Sellmyer et al. | |
| 6,657,289 B1 | 12/2003 | Craig et al. | |
| 6,702,186 B1 | 3/2004 | Hamann et al. | |
| 6,744,583 B2 | 6/2004 | Ikeda et al. | |
| 6,749,955 B2 | 6/2004 | Kirino et al. | |
| 6,780,696 B1 | 8/2004 | Schatz | |
| 6,816,330 B2 | 11/2004 | Ikeda et al. | |
| 6,881,497 B2 | 4/2005 | Coffey et al. | |

(Continued)

FOREIGN PATENT DOCUMENTS

JP    6-85301    3/1994

OTHER PUBLICATIONS

Notice of References Cited, Huber et al., U.S. Appl. No. 11/254,094, 1 Page.

(Continued)

*Primary Examiner* — David S Blum
(74) *Attorney, Agent, or Firm* — Penny A. Clarke

(57) ABSTRACT

A functional block for assembly includes at least one element and a patterned magnetic film comprising at least one magnetic region attached to the element. A wafer includes a host substrate comprising a number of elements. The wafer further includes a patterned magnetic film attached to the elements and comprising a number of magnetic regions. The magnetic regions are attached to respective ones of the elements. A method of manufacture includes forming a number of magnetic regions on a host substrate having an array of elements. The forming step provides at least one of the magnetic regions for a respective group comprising at least one of the elements.

43 Claims, 17 Drawing Sheets

Step 231: Deposit and pattern resist

Step 232: Etch to buried oxide layer and strip resist

U.S. PATENT DOCUMENTS

| | | | |
|---|---|---|---|
| 7,132,222 | B2 | 11/2006 | Chappert et al. |
| 7,217,592 | B2 * | 5/2007 | Nuggehalli et al. ......... 438/107 |
| 7,218,465 | B1 | 5/2007 | Deeman et al. |
| 7,218,466 | B1 | 5/2007 | Deeman et al. |
| 2003/0040129 | A1 | 2/2003 | Shah |
| 2003/0234401 | A1 * | 12/2003 | Fonstad et al. ................. 257/84 |
| 2004/0016998 | A1 | 1/2004 | Fonstad et al. |
| 2005/0201176 | A1 * | 9/2005 | Zangari et al. ................ 365/222 |
| 2005/0266271 | A1 | 12/2005 | Tsuchiya et al. |
| 2006/0051517 | A1 | 3/2006 | Haas et al. |
| 2006/0108442 | A1 | 5/2006 | Russell et al. |
| 2007/0056621 | A1 | 3/2007 | Baskaran |
| 2007/0084501 | A1 | 4/2007 | Kalberlah et al. |
| 2007/0236213 | A1 | 10/2007 | Paden et al. |
| 2008/0135956 | A1 | 6/2008 | Huber et al. |
| 2009/0056513 | A1 | 3/2009 | Baer |
| 2009/0159125 | A1 | 6/2009 | Prather et al. |

OTHER PUBLICATIONS

U.S. Appl. No. 11/254,094, Office Action, dated Dec. 30, 2009.
U.S. Appl. No. 11/254,094, Office Action, dated Apr. 16, 2009.
U.S. Appl. No. 11/254,096, Office Action dated May 6, 2009.
U.S. Appl. No. 11/254,096, Office Action dated Nov. 3, 2009.
Office Action, U.S. Appl. No. 11/637,668, Apr. 16, 2010.
Office Action, U.S. Appl. No. 12/014,356, Aug. 27, 2009.
Office Action, U.S. Appl. No. 12/014,356, Mar. 17, 2010.
M. Anhalt et al., "Magnetic properties of polymer bonded soft magnetic particles for various filler fractions," Journal of Applied Physics, vol. 101, 2007, pp. 023907-1-023907-8.
CPEL0853686, Patent Application No. 200910003480.6, Mar. 9, 2010.
JP 06-085301 Abstract, Mar. 25, 1994.
SPS Technologies, Arnold Magnetic Group Products, Catalogue Technical Notes,TN 0205, Dec. 2002, pp. 1-6.
Office Action, U.S. Appl. No. 11/254,094, Aug. 9, 2010.
JP06-085301 Abstract, Mar. 25, 1994.
W.H. Huber et al., U.S. Appl. No. 11/254,181, Office Action Oct. 15, 2010.
W. H. Huber et al., U.S. Appl. No. 12/014,356, Office Action Sep. 3, 2010.
M. Boncheva et al., "Magnetic self-assembly of three-dimensional surfaces from planar sheets," Department of Chemistry and Chemical biology, Harvard University, www.pnas.org, vol. 102, No. 11, Mar. 15, 2005, pp. 3924-3929.
B. B. Yellen et al., "Arranging matter by magnetic nanoparticle assemblers," Dept. of Mechanical Engineering and Materials Science, Duke University, www.pnas.org, vol. 102, No. 25, Jun. 21, 2005, pp. 8860-8864.
B. B. Yellen et al., "Programmable Assembly of Heterogeneous Colloidal Particle Arrays," Advanced Materials, Jan. 16, 2004, vol. 16, No. 2, pp. 111-115.
Hsi-Jen J. Yeh et al., "Fluidic Self-Assembly for the Integration of GaAs Light-Emitting Diodes on Si Substrates," IEEE Photonics Technology letters, vol. 6, No. 6, Jun. 1994, pp. 706-708.
W. Zheng et al., "Shape-and-solder-directed self-assembly to package semiconductor device segments," Applied Physics letters, vol. 85, No. 16, Oct. 18, 2004, pp. 3635-3637.
U. Srinivasan et al., "Microstructure to Substrate Self-Assembly Using Capillary Forces," Journal of Microelectromechanical Systems, vol. 10, No. 1, Mar. 2001, pp. 17-24.
H. O. Jacobs et al., "Fabrication of a Cylindrical Display by Patterned Assembly," www.sciencemag.org, vol. 296, Apr. 12, 2002, pp. 323-325.
J. Linemann et al., "Modeling, Simulation, and Experimentation of a Promising New Packaging Technology: parallel fluidic Self-Assembly of Microdevices," Albert Ludwig University, Freiburg Germany, Abstract.

* cited by examiner

FUNCTIONAL BLOCKS FOR ASSEMBLY

STATEMENT REGARDING FEDERALLY SPONSORED RESEARCH & DEVELOPMENT

This invention was made with Government support under contract number W911CX04C0099 awarded by the Defense Advanced Research Agency for the Department of Defense. The Government has certain rights in the invention.

CROSS REFERENCE TO RELATED APPLICATIONS

This application is related to commonly assigned, concurrently filed U.S. patent application to W. H. Huber et al., entitled "Article and assembly for magnetically directed self assembly," which application is incorporated by reference herein in its entirety. This application is also related to commonly assigned, concurrently filed U.S. patent application to W. H. Huber et al., entitled "Methods for magnetically directed self assembly," which application is also incorporated by reference herein in its entirety.

BACKGROUND

The invention relates generally to the assembly of components onto a surface, and more particularly, to the assembly of building blocks onto a substrate for electronic circuit fabrication, sensors, energy conversion, photonics and other applications.

There is a concerted effort to develop large area, high performance electronics for applications such as medical imaging, nondestructive testing, industrial inspection, security, displays, lighting and photovoltaics, among others. Two approaches are typically employed. For systems involving large numbers of active elements (for example, transistors) clustered at a relatively small number of locations, a "pick and place" technique is typically employed, for which the active elements are fabricated, for example using single crystal semiconductor wafers, and singulated (separated) into relatively large components (for example, on the order of 5 mm) comprising multiple active elements. The components are sequentially placed on a printed circuit board (PCB). Typically, the components are sequentially positioned on the PCB using robotics. Because the pick and place approach can leverage high performance active elements, it is suitable for fabricating high performance electronics.

A key limitation of the pick and place approach is that the components must be serially placed on the PCB. Therefore, as the number of components to be assembled increases, the manufacturing cost increases to the point where costs become prohibitive. In addition, as the component size decreases, it becomes increasingly difficult to manipulate and position the components using robotics. Accordingly, this technique is ill-suited for the manufacture of low density, distributed electronics, such as flat panel displays or digital x-ray detectors. Instead, a wide-area, thin film transistor (TFT) based approach is typically employed to manufacture low density, distributed electronics. Typically, the TFTs comprise amorphous silicon (a-Si) TFTs fabricated on large glass substrates. Although a-Si TFTs have been successfully fabricated over large areas (e.g. liquid crystal displays), the transistor performance is relatively low and therefore limited to simple switches. In addition, with this process, the unit cost of a large area electronic circuit necessarily scales with the size of the circuit.

Another approach is to substitute a higher mobility semiconducting material, such as polysilicon, cadmium selenide (CdSe), cadmium sulfide (CdS) or germanium (Ge), for a-Si to form higher mobility TFTs. While TFTs formed using these higher mobility materials have been shown to be useful for small-scale circuits, their transistor characteristics are inferior to single crystal transistors, and thus circuits made from these materials are inherently inferior to their single crystal counterparts. As with a-Si, the unit cost of a large area electronic circuit necessarily scales with the size of the circuit, for this process.

A number of approaches have been developed to overcome these problems. For example, U.S. Pat. No. 5,783,856, to Smith et al., entitled "Method for fabricating self-assembling microstructures," employs a fluidic self-assembly process to assemble trapezoidal shaped components dispersed in a solution onto a substrate having corresponding trapezoidal indentations. This approach uses gravity and convective fluid flow to deposit the components in the indentations. Limitations of this technique include: the use of relatively weak forces to dispose and hold the blocks in the indentations. It would further appear to be difficult to assemble a large variety of elements to the substrate due to the limited number of block and indent shapes that can realistically be fabricated.

U.S. Pat. No. 6,657,289, to Craig et al., entitled "Apparatus relating to block configurations and fluidic self assembly process," employs a fluidic self-assembly process to assemble components having at least one asymmetric feature dispersed in a solution onto a substrate having correspondingly shaped receptor sites. Limitations of this technique include: the use of relatively weak forces to dispose and hold the blocks in the shaped sites. It would further appear to be difficult to assemble a large variety of elements to the substrate due to the finite number of component shapes available.

U.S. Pat. No. 6,780,696, to Schatz, entitled "Method and apparatus for self-assembly of functional blocks on a substrate facilitated by electrode pairs," employs another fluidic self-assembly process to assemble trapezoidal shaped components dispersed in a solution onto a substrate having corresponding trapezoidal indentations. However, this approach couples electrodes to the substrate to form an electric field. The approach further forms the components of high-dielectric constant materials, such that the components are attracted to higher electric field regions and are thus guided to the trapezoidal indents. In another embodiment, the component is formed of a low magnetic permeability material, and a high magnetic permeability layer is coupled to the bottom surface of the component. A static magnetic field is generated at a receptor site by covering the receptor site with a permanent magnet having a north and a south pole aligned such that the static magnetic field is aligned parallel to the surface of the receptor site. In another embodiment, a magnetic field is applied parallel to the substrate. The slurry solution has an intermediate value of magnetic permeability. A drawback of this technique is that the components will tend to agglomerate in solution, due to the propensity of high magnetic permeability materials to agglomerate so as to minimize magnetic energy. Another possible limitation on this technique is registration error between the component and the substrate resulting from the use of magnetic fields aligned parallel to the substrate. In addition this technique would not lend itself to the assembly of multiple component types.

U.S. Pat. No. 3,439,416, to Yando, entitled "Method and apparatus for fabricating an array of discrete elements," forms pairs of magnets in a laminated base. Magnetic coatings, such as iron, are applied to the surface of elements. A multiplicity of elements is placed on the surface of the laminated base, which is then vibrated to move the elements. The magnetic coated surfaces of the elements are attracted to the pole faces of the magnet pairs. This technique suffers from several drawbacks, including severe limitations on the shape, size and distribution of the elements. For example, element width must match the spacing of the magnetic layers in the laminated base and the distribution of the elements is restricted by the parallel lamination geometry. In addition the technique appears to be applicable to relatively large, millimeter sized dimensions, and may not be suitable for smaller, micron-sized elements. In addition this technique would not lend itself to the assembly of multiple component types.

"Programmable assembly of heterogeneous colloidal particle arrays," Yellen et al., Adv. Mater. 2004, 16, No. 2, January 16, p. 111-115, employs magnetically programmable assembly to form heterogeneous colloidal particle arrays. This approach utilizes micromagnets that are covered with an array of square microwells and which are magnetized parallel to the plane. The substrate is immersed in a bath, and superparamagnetic colloidal beads are injected into the bath. External magnetic fields are applied perpendicular to the plane in a first direction, causing the beads to be attracted to one pole of the micromagnets. The direction of the external magnetic field is then reversed, causing the beads to be attracted to the other pole of the micromagnets. A drawback of this technique is that it is limited to two types of particles. Another limitation of this technique is that it requires the application of external magnetic fields and appears to be limited to superparamagnetic colloidal beads. Another limitation on this technique is use of microwells to trap the beads. Yield would also appear to be an issue.

It would therefore be desirable to provide systems and methods for fabricating high performance, large area electronics rapidly and inexpensively. It would further be desirable for the improved systems and methods to facilitate the assembly of a variety of different types of elements.

BRIEF DESCRIPTION

Briefly, one aspect of the present invention resides in a functional block for assembly. The functional block includes at least one element and a patterned magnetic film comprising at least one magnetic region attached to the element.

Another aspect of the present invention resides in a wafer that includes a host substrate comprising a number of elements and a patterned magnetic film attached to the elements. The patterned magnetic film comprises a number of magnetic regions, and the magnetic regions are attached to respective ones of the elements.

Yet another aspect of the present invention resides in a method of manufacture. The method includes forming a number of magnetic regions on a host substrate having an array of elements. The forming step provides at least one of the magnetic regions for a respective group comprising at least one of the elements.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
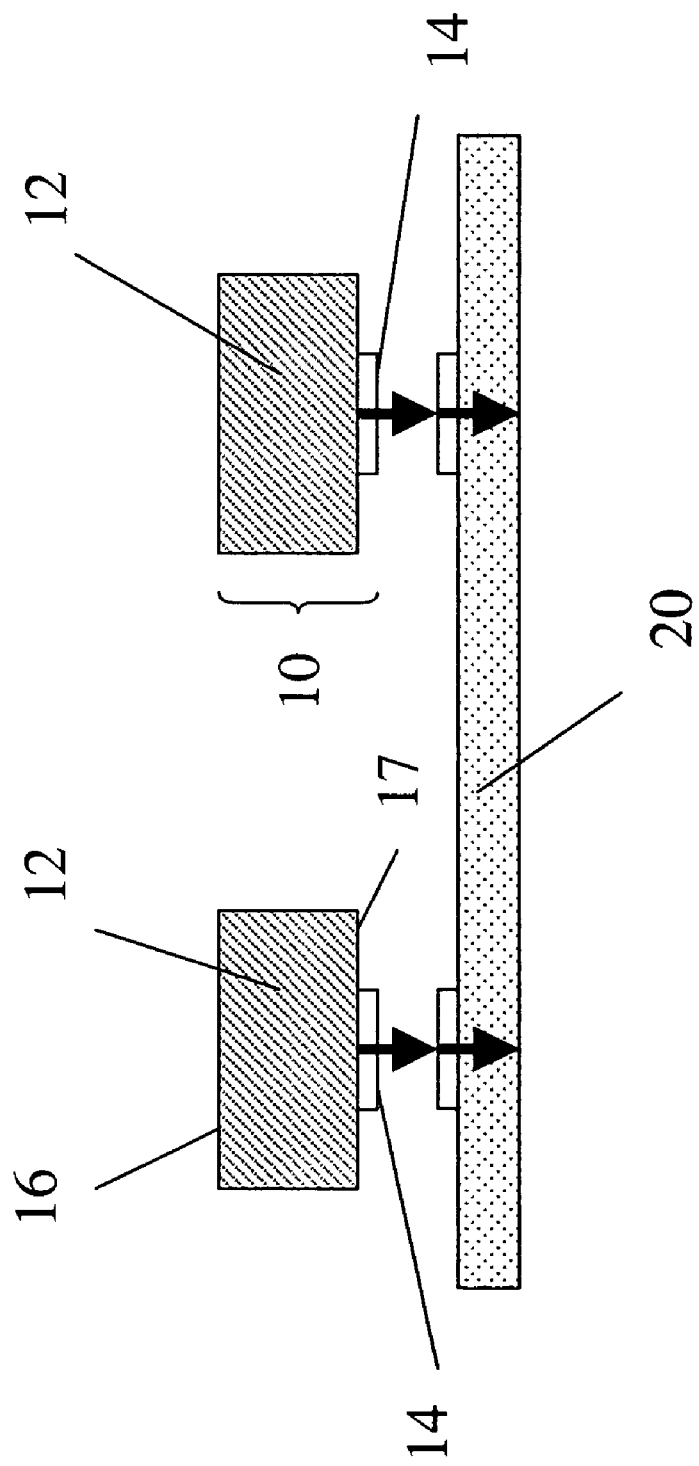
FIG. 1 depicts two exemplary functional blocks for attachment to an article.

A functional block 10 embodiment of the invention is described with reference to FIGS. 1-6. The functional block 10 is configured for magnetically directed self-assembly (MDSA) to an article 20, as illustrated, for example in FIG. 1. The MDSA method is described in commonly assigned, copending, concurrently filed U.S. patent application to W. H. Huber et al. entitled, "Methods for magnetically directed self assembly." As shown, for example in FIG. 1, the functional block 10 includes at least one element 12 and a patterned magnetic film 14 attached to the element 12. As used here, the term "attached" should be understood to include patterned magnetic films 14 deposited on or otherwise affixed, either directly or indirectly, to the element 12 (as indicated in FIG. 1, for example), as well as patterned magnetic films 14 deposited on or otherwise affixed to an intermediate layer (not shown), such as $SiO_2$ or $Si_3N_4$, formed on the element 12. In other examples, the film 14 is attached indirectly to the element, for example the film is affixed to a contact 24 for the element 12. Moreover, the term "attached" also encompasses patterned magnetic films 14 that are partially or fully embedded in the device (not shown). As discussed below in greater detail, in certain embodiments, the element 12 is formed in a semiconductor layer (also indicated by reference numeral 12). Thus, "attached to the element" means attached to the semiconductor layer, for these embodiments. In other words, a region 14 need not be affixed to the active portion of element 12 to be "attached to element 12." Rather, in many configurations, the region may be affixed to an inactive portion of element 12.

Figure 13:
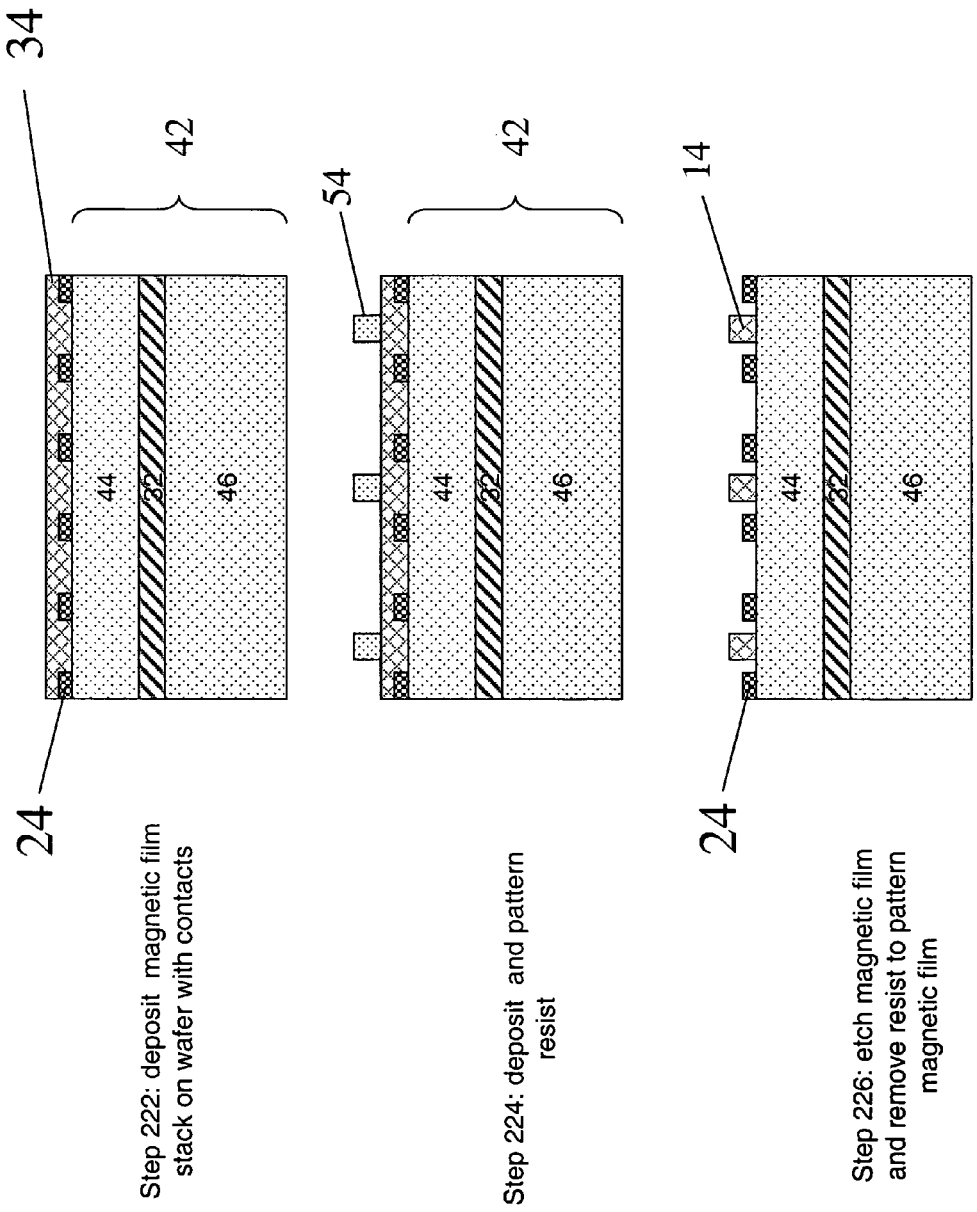
FIG. 13 illustrates exemplary process steps for forming a patterned magnetic film.
Figure 17:
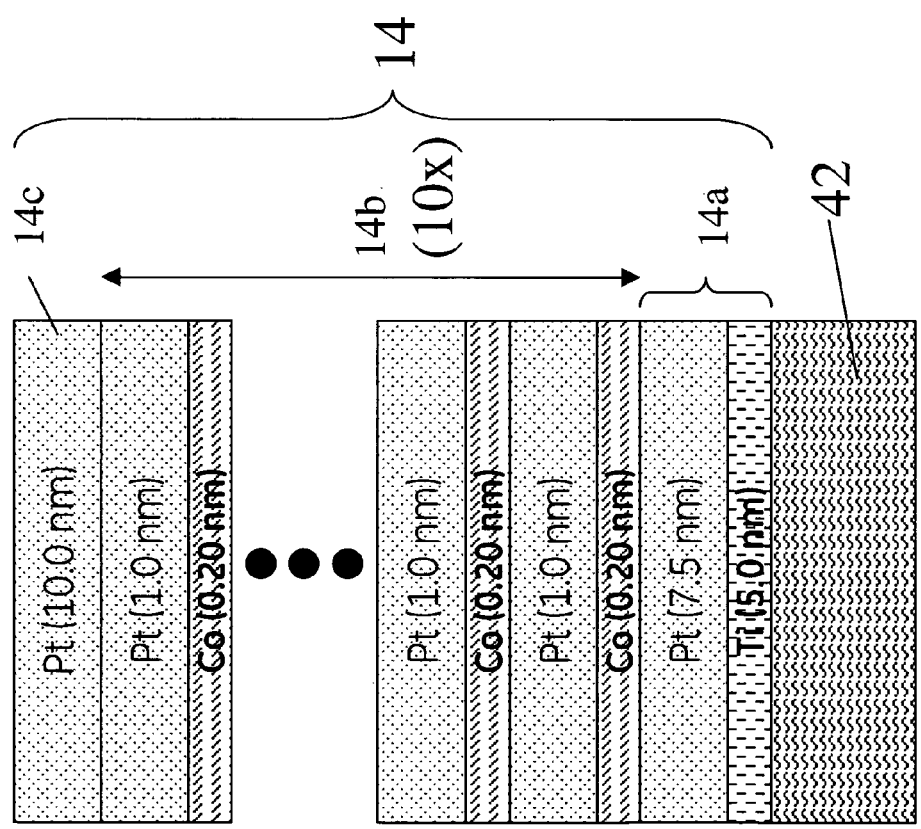
FIG. 17 depicts an exemplary multilayer magnetic film.

As used herein, the term "film" refers to a structure having one or more layers. FIG. 17 illustrates an exemplary multilayer film embodiment, for example. For particular embodiments, the thickness of the structure is less than or equal to 100 microns. In other embodiments, non-magnetic spacer layers (not shown) are included, and the thickness of the structure is less than about one mm. For the arrangement shown in FIG. 2, the thickness of the film 14 is measured in the z direction. By "patterned" it is meant that the film has a shape, such that it does not extend across the entire surface of the element 12. The film 14 can be patterned using lithographic techniques, for example. As discussed in detail below, FIG. 13 illustrates an exemplary patterning process for patterning an un-patterned magnetic film 34 to form a patterned magnetic film 14. The patterned magnetic film 14 comprises one or more magnetic regions (also indicated by reference numeral 14). The magnetic region(s) 14 could be formed on the connecting surface 17 of the element 12, could be formed on an intermediate layer (not shown), could be disposed in the element 12 and either contained within the element 12 or extend past the connecting surface 17.

For certain embodiments, the functional block 10 includes a number of magnetic regions 14. In other embodiments, the functional block has a single magnetic region 14. Further, it should be noted that the magnetic region 14 may have any shape and may be symmetric or asymmetric. The depicted shapes for the regions 14 are merely illustrated examples.

As noted above, the magnetic region 14 may be rotationally symmetric or asymmetric about an axis that is perpendicular to the surface 7 of the magnetic region. As used herein, the term "rotationally symmetric" refers to geometries wherein any rotation of the functional block 12 around an axis perpendicular to the magnetic film 14, does not affect the position of the patterned magnetic film 14 or the contacts 24. For the exemplary embodiments shown in FIGS. 4, 5, and 9, the magnetic region 14 is symmetric. For each of the embodiments of FIGS. 7 and 10, the individual magnetic region 14 is not rotationally symmetric. For the embodiments shown in FIGS. 6 and 8, the patterned magnetic film 14 comprises magnetic regions 14 arranged in a rotationally asymmetric configuration. For the illustrated embodiment of FIG. 6, the individual magnetic regions 14 are rotationally symmetric, but all symmetry is broken by arranging the magnetic regions in opposite polarities.

The element 12 has a connecting surface 17, and the magnetic region 14 is configured to exhibit a magnetic moment μ that is oriented in a range of plus or minus forty-five degrees from a surface normal 19 for the connecting surface 17. By "configured" it is meant that the specified magnetic moment μ can be generated by application of a suitably large magnetic field and after such generation remains even in the absence of an applied magnetic field. As indicated, for example in FIG. 1, the connecting surface 17 is the surface of the element 12 configured to face the article 20. According to a more particular embodiment, the magnetic moment μ is oriented in a range of plus or minus twenty degrees, and more particularly, in a range of plus or minus ten degrees, from the surface normal 19 for the connecting surface 17. For the exemplary embodiment of FIG. 2, the magnetic moment μ is aligned along the surface normal 19 for the connecting surface 17. Beneficially, by aligning the magnetic moment μ of the patterned magnetic film 14 along the surface normal 19, connecting surfaces 17 of multiple elements 12 will repulse each other. In this manner, the tendency of the functional blocks 10 to agglomerate when dispensed in slurry, is reduced.

Figure 3:
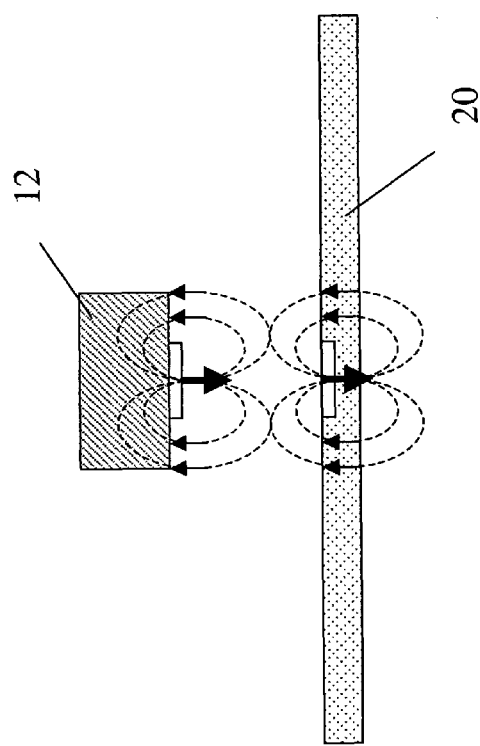
FIG. 3 illustrates an exemplary dipole binding configuration for the magnetic moments of an exemplary functional block and article in side view.

FIG. 3 illustrates an exemplary dipole configuration for the magnetic moment μ of the patterned film 14. For the exemplary embodiment depicted in FIG. 3, the patterned magnetic film 14 is arranged in a dipole configuration and comprises a material with a perpendicular magnetic anisotropy. By "perpendicular magnetic anisotropy" it is meant that it is energetically favorable to have the magnetic moment aligned perpendicular to the plane of the patterned film. Examples of materials with perpendicular magnetic anisotropy include, without limitation, Cobalt-Platinum multilayers, Cobalt-Palladium multilayers, Iron-Gadolinium Terbium alloy and related rare-earth alloys. It should be understood that the term "dipole configuration" as used herein does not require a perfect dipole but rather is intended to distinguish the film configuration from other configurations, such as a quadrupole configuration.

Figure 5:
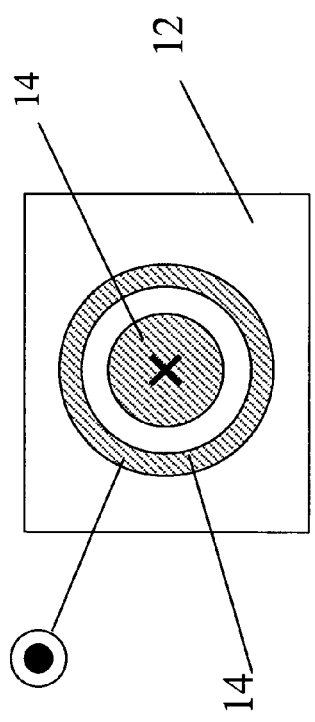
FIG. 5 depicts an exemplary symmetric quadrupole configuration for the magnetic moment of an exemplary functional block.
Figure 6:
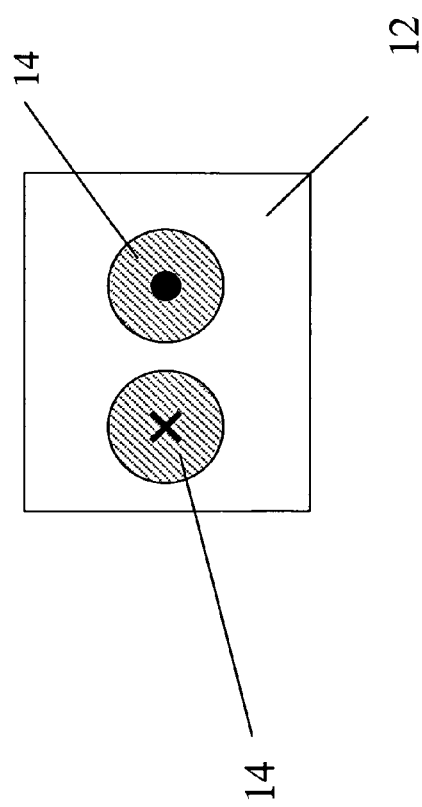
FIG. 6 depicts an exemplary asymmetric quadrupole configuration for the magnetic moment of an exemplary functional block.

FIGS. 5 and 6 illustrate two exemplary quadrupole configurations for the magnetic moment μ of the patterned film 14. FIGS. 5 and 6 show the connecting surface 17 of the element 12 with the magnetic regions 14 arranged thereon. For the exemplary embodiment depicted in FIGS. 5 and 6, the patterned magnetic film 14 comprises a number of magnetic regions 14 arranged in a quadrupole configuration. For the exemplary configuration of FIG. 5, the inner and outer magnetic regions 14 have the same area (and hence volume) and opposite directions of magnetization. Similarly, for the exemplary configuration of FIG. 6, the neighboring regions 14 have the same area (an hence volume) and opposite direction of magnetization. According to a more particular embodiment, the patterned magnetic film 14 comprises a material with a perpendicular magnetic anisotropy. It should be understood that the term "quadrupole configuration" as used herein does not require a perfect quadrupole but rather is intended to distinguish the film configuration from other configurations, such as a dipole configuration.

Figure 2:
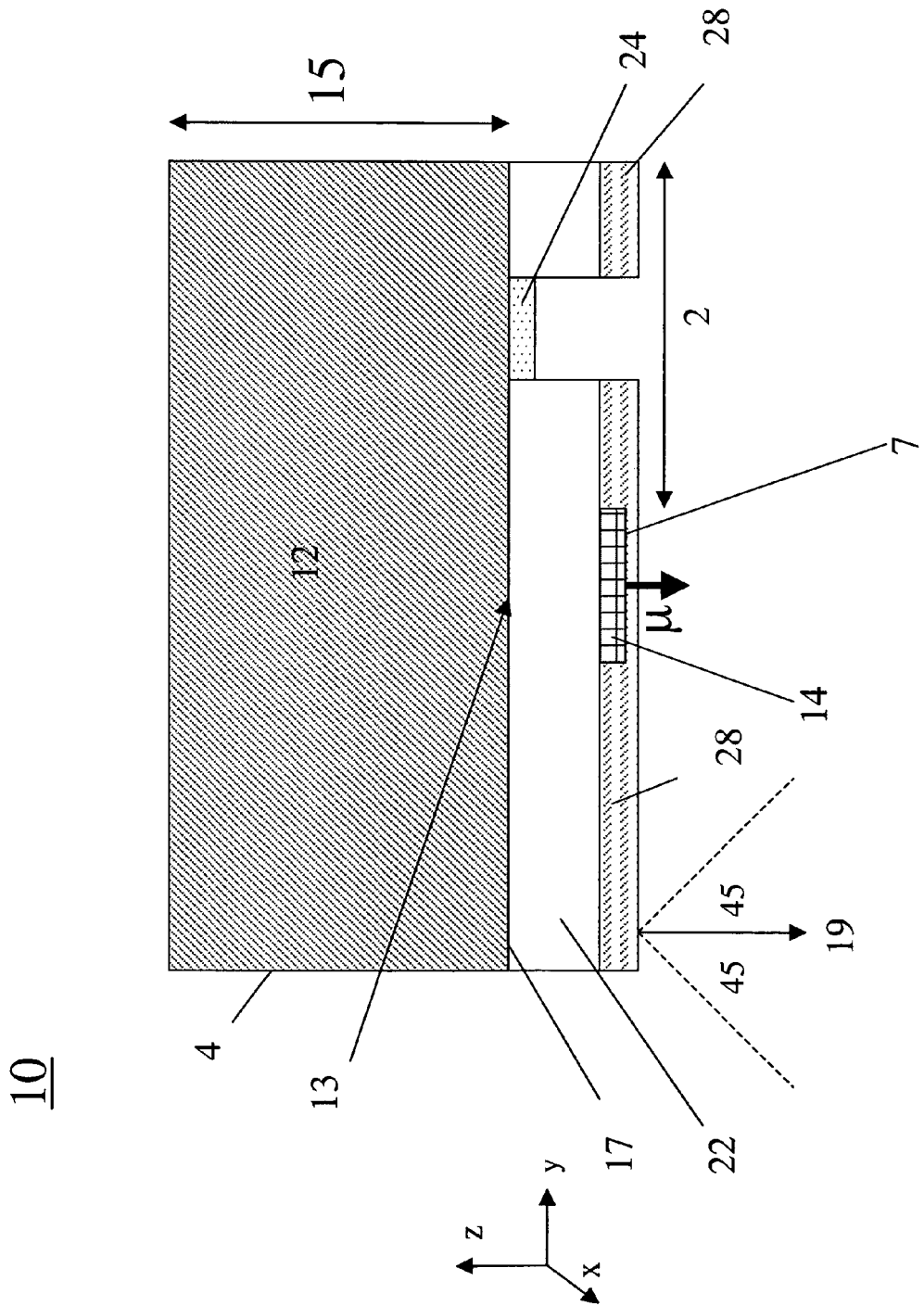
FIG. 2 illustrates an exemplary functional block embodiment of the present invention.
Figure 4:
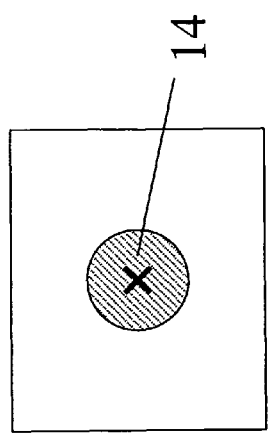
FIG. 4 illustrates an exemplary dipole configuration for the magnetic moment of an exemplary functional block in top view.

As described in Huber et al., "Methods for magnetically directed self assembly," during assembly the functional blocks 10 may be suspended in a slurry (not shown). In order for the functional blocks 10 to be deposited in the receptor sites 74 on the article 20, as desired, the functional blocks 10 should be configured such that they do not stick to one another in the slurry 68. As shown in FIG. 1, the free surface of the element 12 is indicated by reference numeral 16. According to a particular embodiment, the magnitude of the magnetic moment μ for the magnetic region 14 is selected such that the functional block 10 is not configured to agglomerate to another functional block 10 at the free surface 16. The magnitude of the magnetic moment μ is a function of the volume and magnetization of the patterned film 14 (μ=Volume×magnetization or μ=thickness×area×magnetization). As shown in FIG. 2, the thickness $t_e$ of the element 12 is indicated by reference numeral 15. The strength of the magnetic fields generated by the respective magnetic regions 14 of the functional blocks 10 in a slurry falls off with distance. Thus, the thickness 15 of the elements 12 determines an upper limit for the magnitude of the magnetic moment μ of the regions 14. For example, if the magnetic regions 14 are circular, have a magnetization of $1.44 \times 10^6$ A/m, a thickness of $1.8 \times 10^{-9}$ m and a diameter of $5 \times 10^{-6}$ m, the thickness 15 of the elements 12 would need to be at least approximately $5 \times 10^{-5}$ m to keep the connecting surface 17 of one functional block 10 from attaching to the free surface 16 of another functional block. In the above example, the minimum value of element thickness 15 was determined by the thickness at which the magnetic binding energy is comparable to the thermal energy. For certain applications, the thickness of the elements is in a range of about 0.1 micron to about 100 microns. According to more particular embodiments, the thickness of the elements is in a range of about 10-100 microns.

The coercivity $H_c$ of the patterned magnetic film 14 should be selected such that the magnetic films 14 preserve their magnetic moments μ for assembly to the article 20. As used here, the coercivity $H_c$ is the applied magnetic field required to reverse the magnetic moment μ. According to a particular embodiment, the patterned magnetic film 14 is characterized by a coercivity ($H_c$) of at least about ten Oersteads (Oe). According to more particular embodiments, the coercivity ($H_c$) is at least about thirty Oe, and still more particularly, at least about one hundred (100) Oe, and still more particularly, at least about one thousand (1000) Oe.

In order to prevent agglomeration of the functional blocks 10 in the slurry during assembly, "pull-back" of the magnetic regions 14 is desirable. For the exemplary embodiment of FIG. 2, for example, at least one magnetic region is disposed in an interior 13 of the element 12. As used here, the term "interior" is used relative to the X-Y plane and is intended to be distinguished from the perimeter of the element. According to a particular embodiment, a gap 2 between the magnetic region 14 and a perimeter 4 of the element 12 is at least about $0.1 t_e$, where $t_e$ is the thickness 15 of the element 12, as noted above. As used here, the gap 2, is the minimum value of the distance between the region 14 and the perimeter 4. For example, for a circular region 14 and a rectangular perimeter 4, the distance between the region and the perimeter varies. The gap 2 is defined to be the minimum value of the distance between the region 14 and the perimeter 4. According to a more particular embodiment, the gap 2 is at least about $0.25 t_e$, and still more particularly, the gap is at least about $0.4 t_e$. The desired pull-back is determined at least in part by the magnitude of the magnetic moment μ of the magnetic regions 14 and the shape of the magnetic regions 14. Although pull-back is generally desirable, for other configurations (not shown), the regions 14 may be disposed near the perimeter of the element 12.

Figure 7:
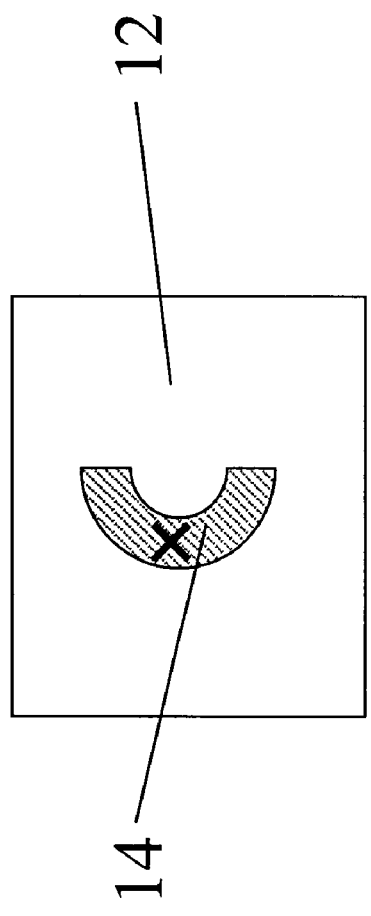
FIG. 7 illustrates an example of an asymmetric patterned magnetic region in a dipole configuration.
Figure 8:
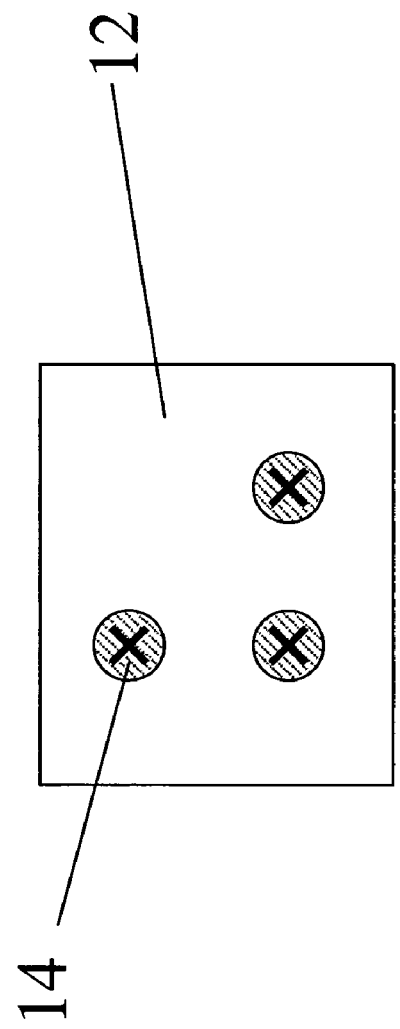
FIG. 8 illustrates another example of asymmetric patterned magnetic regions in a dipole configuration.
Figure 10:
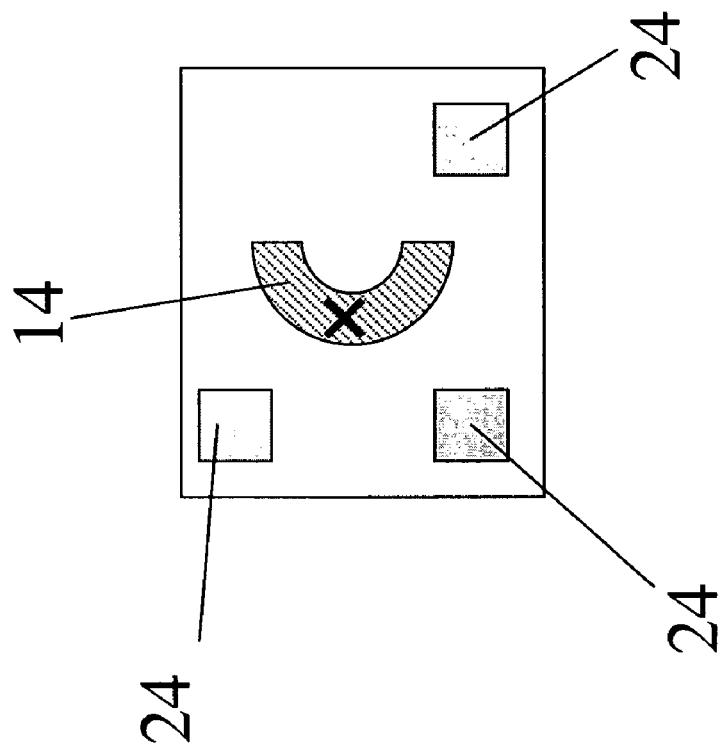
FIG. 10 shows transistor electrodes formed on a functional block with asymmetric contacts and a symmetric patterned magnetic region in a dipole configuration.
Figure 9:
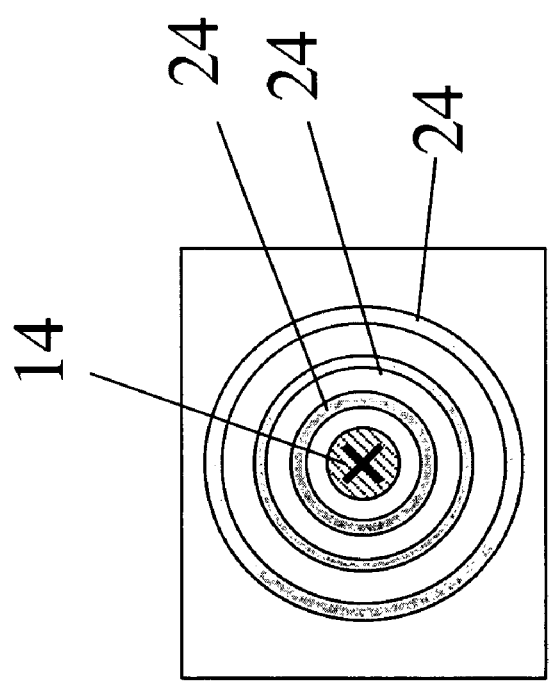
FIG. 9 shows transistor electrodes formed on a functional block with symmetric contacts and a symmetric patterned magnetic region in a dipole configuration.

Although the exemplary magnetic films 14 shown in FIGS. 4-6, 8 and 9 are circular, the magnetic film 14 may have a footprint which is curved, (for example semi-ring shaped) or which is polygonal (for example rectangular). Examples of non-circular magnetic region are shown in FIGS. 7 and 10.

EXAMPLE

The patterned magnetic film 14 may be fabricated from a variety of different materials using a variety of different techniques. For example, a perpendicular magnetic film may be constructed as a multilayer film (also indicated by reference numeral 14). In one non-limiting example illustrated by FIG. 17, a multilayer magnetic film 14 is constructed by sequentially depositing a series of individual layers comprising a base region 14a, an active region 14b and a capping region 14c. The multilayer film 14 may be deposited using a variety of different deposition processes, non-limiting examples of which include electron beam evaporation, sputtering, resistive source evaporation and electroplating.

In one non-limiting example, a perpendicular magnetic film may be generated via electron beam evaporation of Cobalt/Platinum multilayers in the active region 14b. For the example illustrated by FIG. 17, the base region 14a comprises approximately 5.0 nm of Titanium (Ti) followed by approximately 7.5 nm of Platinum (Pt). The active region 14b for this example comprises a multilayer stack wherein approximately 0.2 nm of Cobalt (Co) is alternated with approximately 1.0 nm of Pt to build an active region 14b with approximately 10 layers of Co. For this example, the capping region 14c comprises approximately 10 nm of Pt. For the exemplary structure of FIG. 17, the multilayer film 14 is formed on a substrate 42. According to a particular example, the substrate 42 is a SOI substrate.

Figure 18:
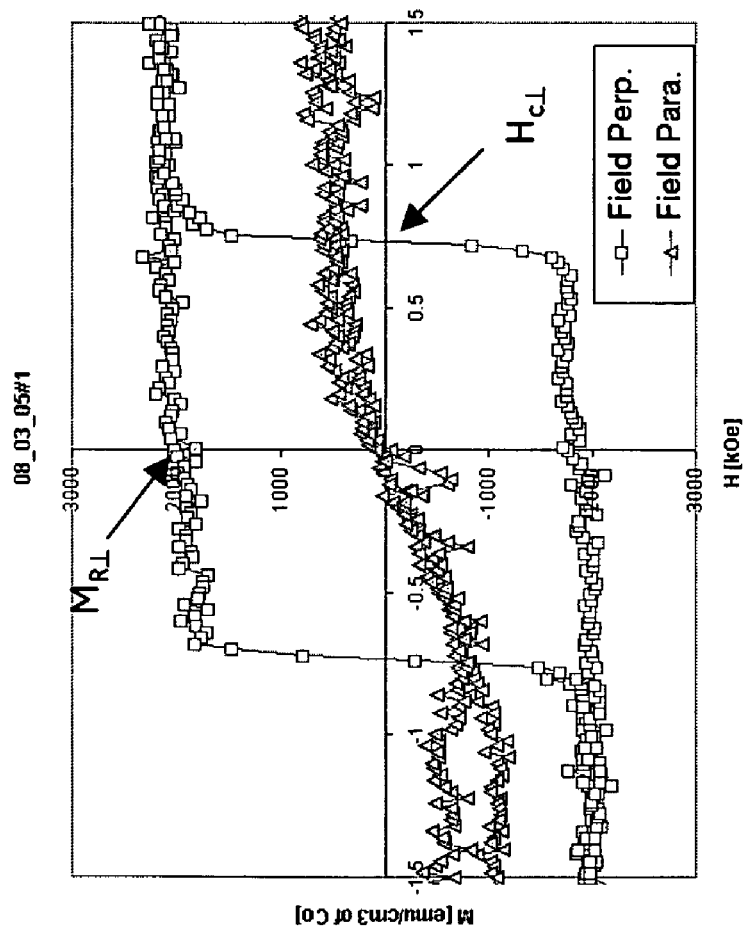
FIG. 18 shows exemplary data for the parallel and perpendicular magnetic response of an exemplary Co/Pt multilayer film.

FIG. 18 shows the parallel and perpendicular magnetic response of the exemplary multilayer film 14 of FIG. 17. For this example multilayer film 14, the remanent magnetization in the perpendicular direction is approximately 2000 emu/cm$^3$ and is nearly zero in the parallel direction. Thus, the magnetic moment will preferentially align in the perpendicular direction. In addition, the coercive field (Hc) required to flip the direction of the perpendicular magnetization is approximately 600 Oe for this exemplary film 14.

Returning now to the general description of the invention, although FIGS. 1-3 depict elements 12 with flat connecting surfaces 17, the elements 12 may also have a curved connecting surface 17 (not shown). For example, the connecting surface 17 may be concave, convex or ruffled.

The present invention can be used with a wide variety of elements 12, and exemplary elements 12 include without limitation semiconductor devices, passive elements, photonic band-gap elements, luminescent materials, sensors, micro-electrical mechanical systems (MEMS) and energy harvesting devices (such as photovoltaic cells). As used here, the term "passive element" should be understood to refer to passive circuit elements, non-limiting examples of which include resistors, capacitors, inductors, and diodes. Exemplary semiconductor devices 12 include, without limitation, transistors, diodes, logic gates, amplifiers and memory circuits. Examples of transistors include, without limitation, field effect transistors (FETs), MOSFETs, MISFETs, IGBTs, bipolar transistors and J-FETs. The semiconductor devices may for example comprise Si, GaN, GaAs, InP, SiC, SiGe or other semiconductors.

A functional block 10 may include a single element 12 or a group of elements 12. A group of elements 12 for a functional block 10 may include different types of elements. For example, a functional block may comprise multiple transistors configured as a digital logic gate or an analog amplifier.

Figure 11:
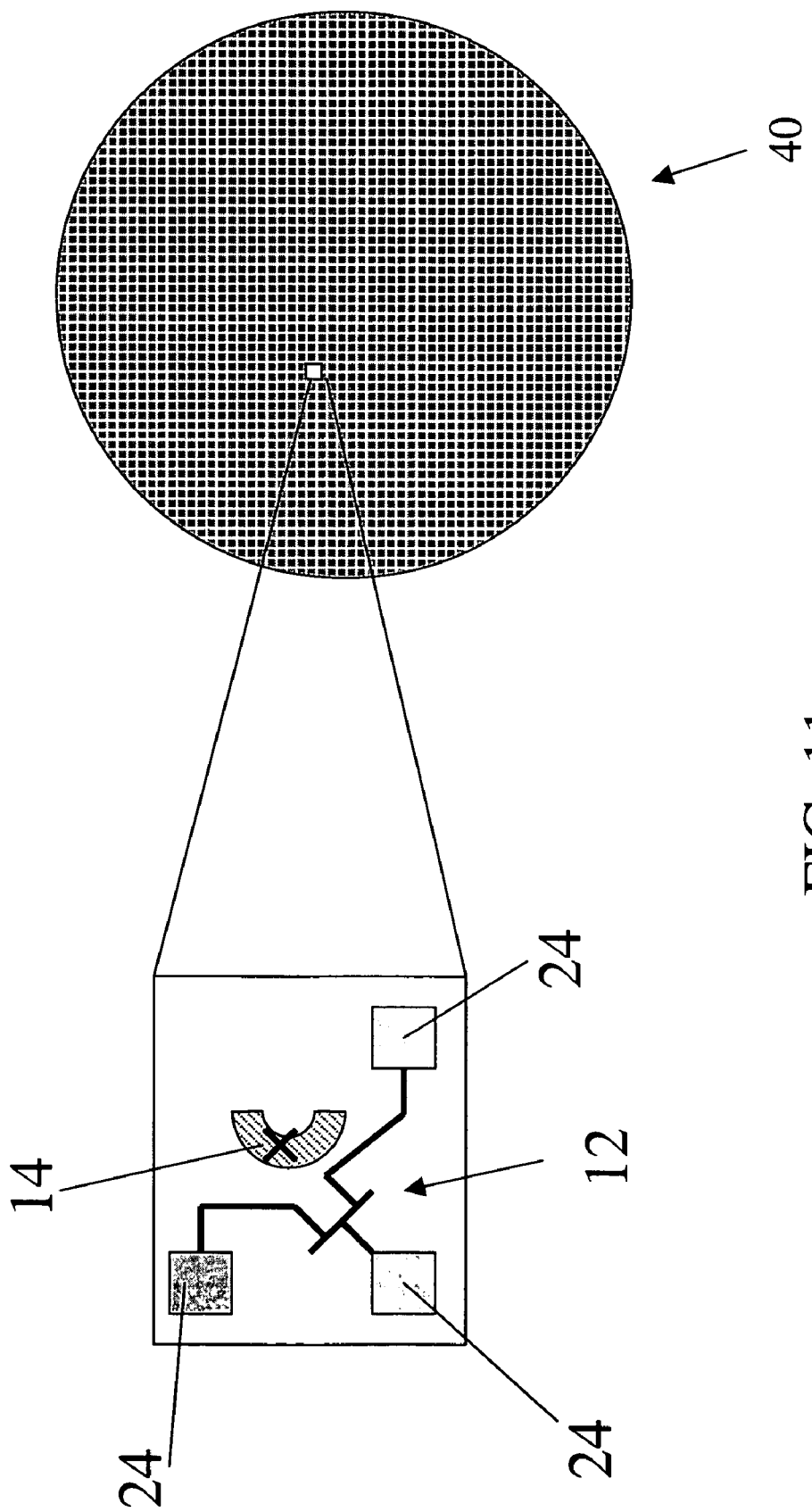
FIG. 11 illustrates an exemplary wafer embodiment of the present invention with an exemplary sub-unit shown in enlarged view.

In one example, the element 12 includes a field effect transistor formed on single-crystal silicon, as depicted for example, in FIG. 11. Efforts are on-going to create high-quality, large-area devices, such as displays and x-ray detectors. However, the formation of a large-area array of high-quality transistors is a limiting factor. Silicon wafer processing currently produces the highest quality transistors, but the wafers are limited in size (typically about 300 mm). Larger arrays of transistors can be formed using amorphous-silicon (α-Si) or poly-silicon (poly-Si). However, α-Si and poly-Si transistors are typically characterized by low mobility, large feature size (the channel length, which is the distance between the source and the drain, is typically on the order of 4 microns for commercial devices) and the gate dielectric is typically of relatively low quality. Consequently, the α-Si and poly-Si transistors typically are slow, exhibit poor gain and drift, relative to single crystal Si transistors. Further, both the α-Si and poly-Si are also limited in size, such that arrays produced using these techniques are typically less than about 2 meters by 2 meters in area. Beneficially, the functional blocks 10 can be used to assemble to an article 20 to provide the performance benefits of single-crystal silicon FETs at a low cost for the larger article 20. Because the FETs are formed in a separate process and assembled to the article 20, there is no upper limit on the size of the article 20. Further, because the cost per unit area of assembled substrate is dictated by the density of functional blocks 10 and the cost of the article 20, by utilizing small-area functional blocks, high quality FET arrays can be assembled to large area articles 20 (for example 10 m×10 m) at relatively low cost.

Many of these elements 12, such as the semiconductor devices, require electrical contacts. For many embodiments, the functional block 10 further includes at least one contact 24 for the element 12, as shown for example in FIGS. 2, 20 and 21. The contacts are formed of conductive materials, non-limiting examples of which include gold, platinum, nickel, copper, aluminum, titanium, tungsten, tantalum, molybdenum and alloys. The contacts 24 can be configured as desired. For example, for the exemplary embodiment shown in FIG. 9, the magnetic region 14 is circular, and the contacts 24 are formed as rings centered on the magnetic region. By using contacts with circular symmetry, magnetic regions can be utilized with circular symmetry. Alternatively, if the magnetic regions are not symmetric, as shown by example in FIG. 10, the contacts 24 do not require circular symmetry. After assembly, it is desirable to fasten the functional block 10 to the article 20, for example by solder or other fastening means. According to a particular embodiment, the at least one contact 24 is configured to fasten the functional block to an article 20 after assembly of the functional block to the article 20. Non-limiting examples of contact materials further include solders, such as Indium, Tin, Lead, Bismuth, Silver, Cadmium, Zinc and various alloys. The solder may be deposited on a gold or other conductive film, for example, forming a layered structure. The solder may be deposited on the contacts 24 to the functional blocks 10 and/or deposited on the article 20.

Figure 20:
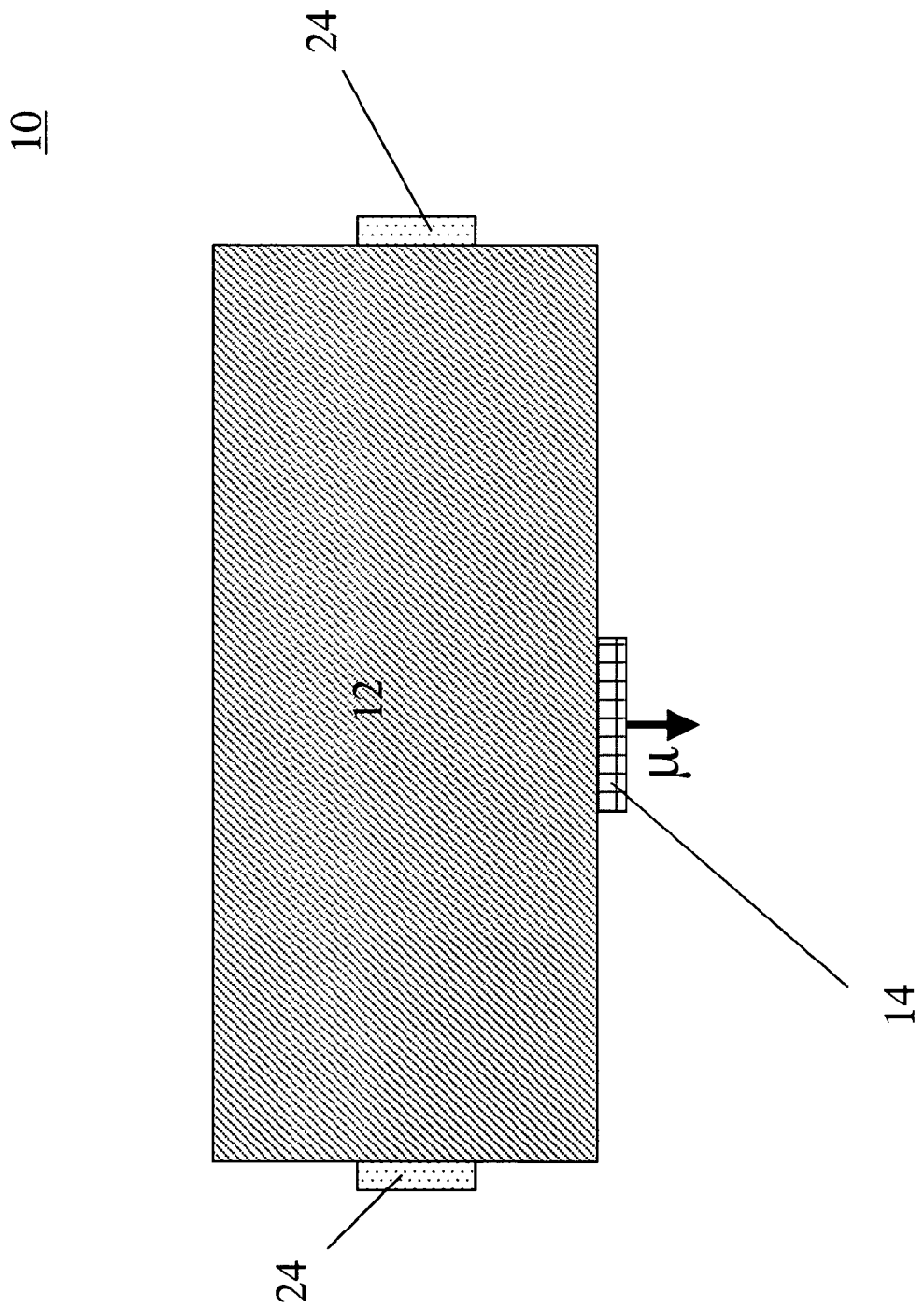
FIG. 20 shows another contact configuration for the functional block.
Figure 21:
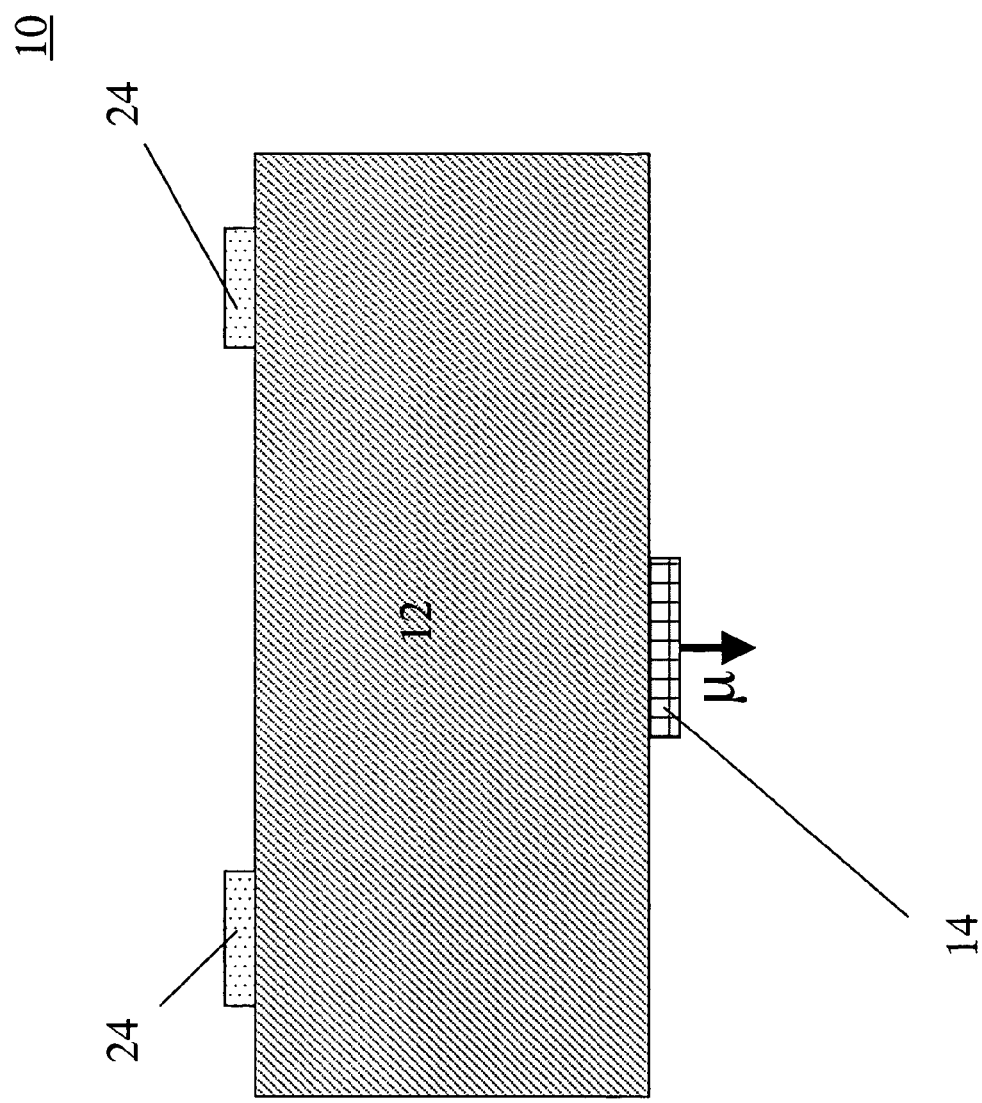
FIG. 21 shows yet another contact configuration for the functional block.

FIGS. 2, 20 and 21 depict exemplary contact configurations for functional block 10. FIG. 2 illustrates an example front contact 24 configuration. Similarly, FIG. 20 illustrates an example side contact 24 configuration. FIG. 21 depicts an example back contact 24 configuration. In other embodiments (not expressly shown), the contact configuration combines front, and/or side and/or back contact configurations.

As shown, for example, in FIG. 2, for particular embodiments, the functional block 10 further includes a protective layer 22 configured to protect the functional block 12. For the exemplary configuration shown in FIG. 2, the protective layer 22 is formed over portions of element 12. The protective layer 22 can be organic or inorganic, and example materials for the protective layer 22 include, without limitation, $Si_3N_4$ (silicon nitride), $SiO_2$ (silicon dioxide), polyimide, BCP and paraylene. Polyimide is an organic polymer, examples of which include materials marketed under the trade names Kapton® and Upilex®. Upilex® is commercially available from UBE Industries, Ltd., and Kapton® is commercially available from E. I. du Pont de Nemours and Company. Other exemplary flexible organic polymers include polyethersulfone (PES) from BASF, polyethyleneterephthalate (PET or polyester) from E. I. du Pont de Nemours and Company, polyethylenenaphthalate (PEN) from E. I. du Pont de Nemours and Company, and polyetherimide (PEI) from General Electric.

As discussed above, solder is used for certain embodiments to fasten the functional blocks 10 to the article 20 after assembly. For other embodiments, the functional block 10 further includes an activated adhesive 28 attached to the functional block 10 (not shown) and configured to fasten the functional block 10 to an article 20 after assembly of the functional block to the article and upon activation. The adhesive 28 may be attached directly or indirectly to the element 12. Examples of activated adhesives 28 include, without limitation, photopolymerizable acrylate adhesives. Depending on the adhesive used, the activation may comprise application of ultraviolet light or thermal activation, for example. Other adhesives may be chemically activated.

Figure 16:
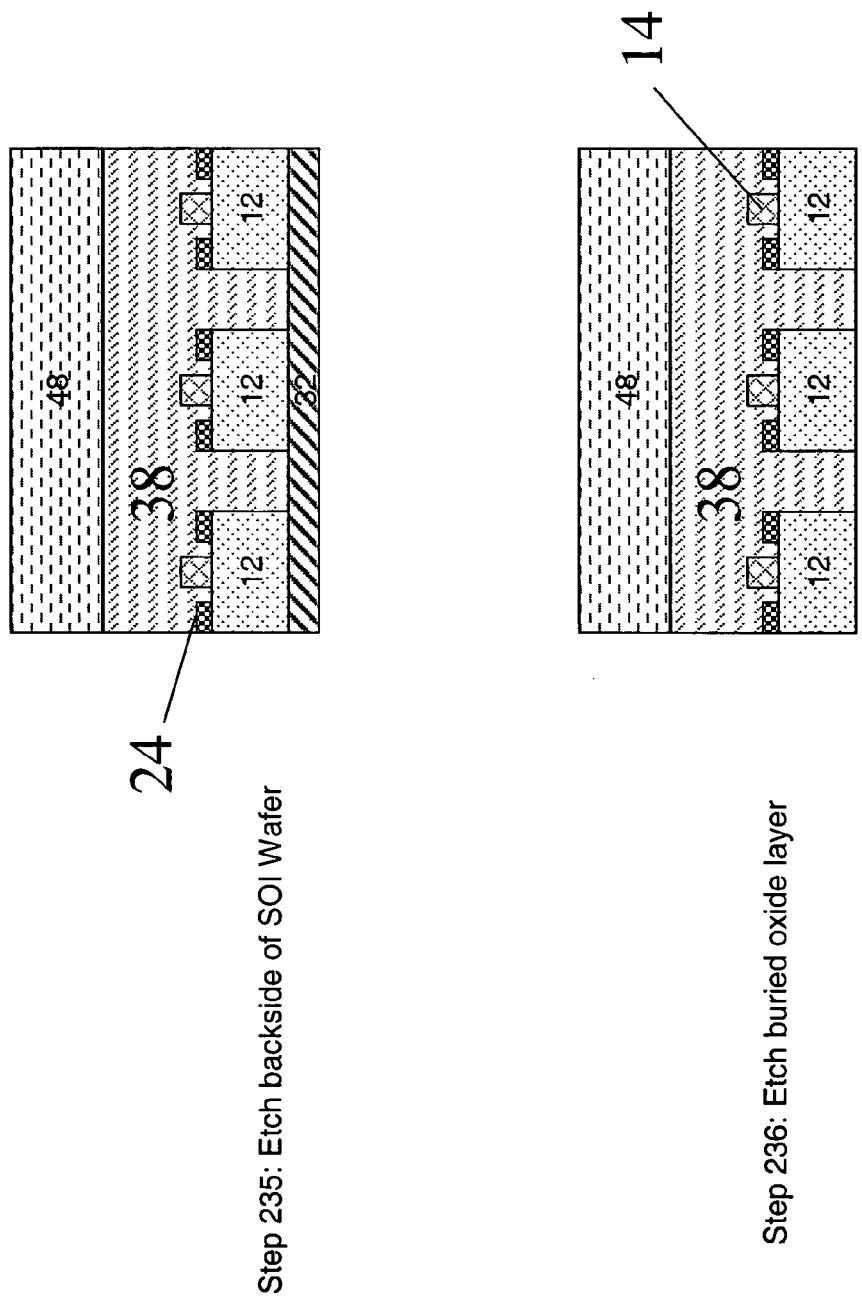
FIG. 16 illustrates further exemplary process steps for defining the functional blocks.

An example functional block 10 embodiment of the invention is described with reference to FIGS. 2 and 16. As indicated, for example in FIG. 2, the functional block 10 for assembly includes at least one element 12 having a connecting surface 17 and a patterned magnetic film 14 attached to the element. The patterned magnetic film comprises at least one magnetic region 14 and, as indicated for example in FIG. 2, is configured to exhibit a magnetic moment ($\mu$) that is oriented in a range of plus or minus forty-five degrees from a surface normal for the connecting surface 17. According to a particular embodiment, the patterned magnetic film 14 comprises a material with a perpendicular magnetic anisotropy.

According to a more particular embodiment, the element 12 comprises a semiconductor-based element, and, as indicated for example in FIG. 2, the functional block 10 further includes at least one electrical contact 24 for the element and a protective layer 22 configured to protect the element 12. As discussed in greater detail below, FIGS. 13-16 illustrate a SOI embodiment of the invention. FIG. 16 shows several blocks 10 prior to dispersion in a solution. In a particular embodiment, the functional block 10 further includes an oxide layer 32 formed on a free surface 16 of the element 12. Although FIG. 16 shows the removal of oxide layer 32 at step 236, a portion of layer 32 may remain and would serve as a protective layer for element 12. According to a more particular embodiment, the semiconductor-based element comprises a silicon-based element, and the oxide layer 32 comprises silicon dioxide ($SiO_2$). Depending on the application, the thickness of the element 12 varies. However, for certain semiconductor embodiments, the thickness 15 of the element is in range of about 0.1 micron to about 100 microns (10-100 microns).

A wafer 40 embodiment of the invention is described with reference to FIGS. 11 and 19. As shown for example in FIG. 19, the wafer 40 includes a host substrate 42 comprising a number of elements 12. The elements 12 are shown as field effect transistors (FETs) 12 in FIG. 11, as an example. As indicated in FIG. 11, the wafer 40 further includes a patterned magnetic film 14 comprising a number of magnetic regions 14, formed by patterning an un-patterned magnetic film 34, as shown for example in FIG. 13. For particular embodiments, the patterned magnetic film 14 (and hence regions 14) comprises a material with a perpendicular magnetic anisotropy.

According to a particular embodiment, the host substrate comprises a semiconductor, non-limiting examples of which include silicon (Si), silicon carbide (SiC), gallium nitride (GaN) and gallium arsenide (GaAs). For the exemplary embodiments depicted in FIG. 11, the wafer 40 further includes a number of contacts 24 to the elements 12. The asymmetric region 14 shown in FIG. 11 is simply one example. For the exemplary embodiments depicted in FIG. 19, the wafer 40 further includes a number of contacts 24 for the elements 12 and a protective layer (not shown in FIG. 19, see instead FIG. 2) disposed over the elements 12 (as shown, for example, in FIG. 2). Example contact materials and configurations are discussed above. Example materials for protective layer 22 are also discussed above.

Figure 19:
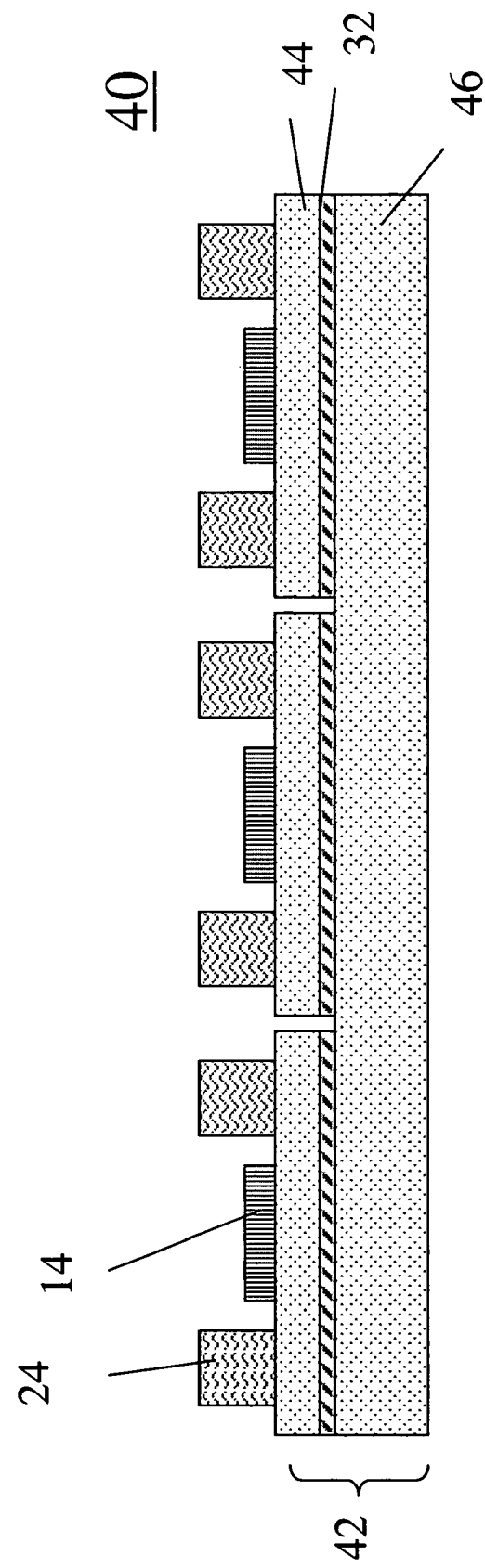
FIG. 19 illustrates an exemplary wafer embodiment of the present invention.

For the exemplary embodiment depicted in FIG. 19, the host substrate 42 comprises a semiconductor layer 44 and an oxide layer 32 disposed under the semiconductor layer. More particularly, the host substrate 42 further comprises a support semiconductor layer 46 disposed under the oxide layer 32, and the oxide layer 32 is a buried oxide layer 32. In one example, the semiconductor layer 44 and the support semiconductor layer 46 comprise silicon, the oxide layer 32 comprises silicon dioxide ($SiO_2$), and the substrate 42 comprises a silicon on oxide (SOI) structure 42.

A method of manufacture is described with reference to FIGS. 12-16. The manufacturing method is used to manufacture wafers 40 and functional blocks 10 for magnetically directed self-assembly. As indicated for example in FIG. 12, the method includes at step 220 forming a number of magnetic regions 14 on a host substrate 42 having an array of elements 12, where the forming step 220 provides at least one of the magnetic regions 14 for each respective group of elements 12. As indicated for example in FIG. 12, for particular embodiments, the method further includes at step 200 forming the elements 12 on the host substrate 42 prior to the forming the magnetic regions 14 step 220. Non-limiting examples of elements 12 include semiconductor devices, passive elements, photonic bandgap elements, luminescent elements, sensors, micro-electrical mechanical systems (MEMSs), energy harvesting devices and combinations thereof.

Figure 12:
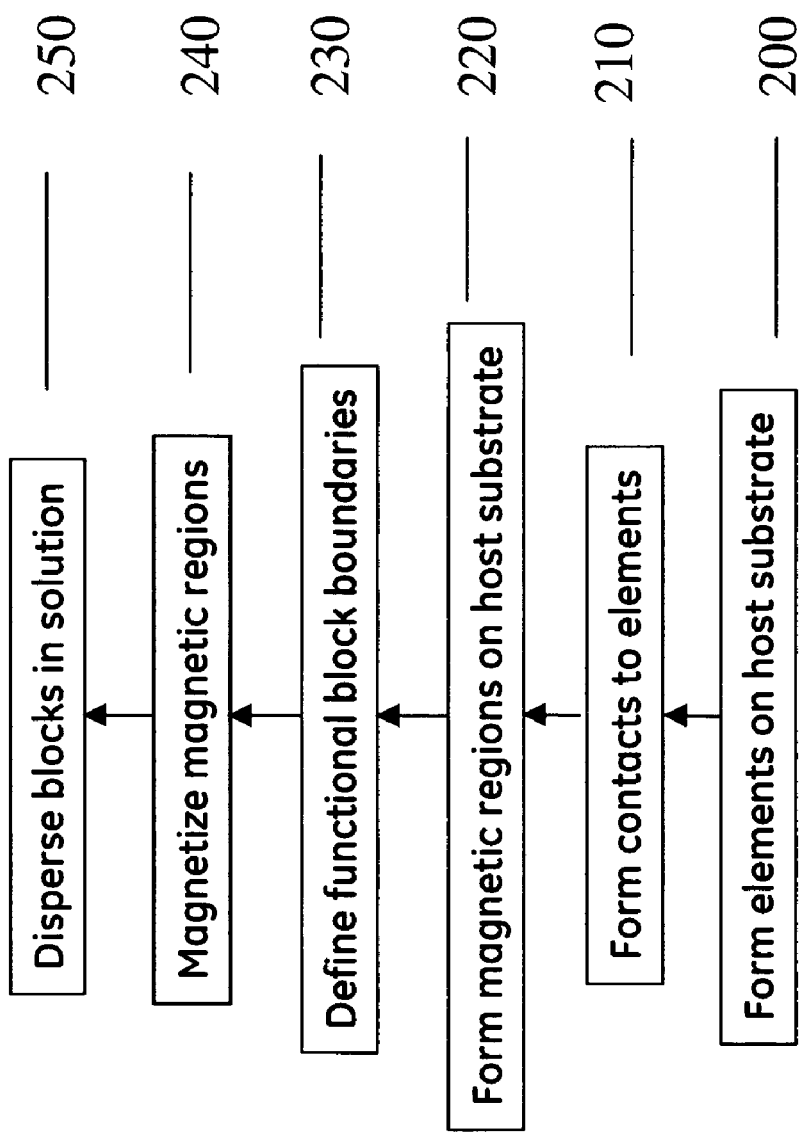
FIG. 12 is an exemplary process diagram for forming functional blocks.

As indicated for example in FIG. 12, the method further includes an optional step 210 to fabricate electrical contacts to the elements. Electrical contacts can be formed, for example, using known techniques. Although FIG. 13 shows the contacts=24 in a front configuration, the contacts 24 may also be side or back mounted as shown, for example, in FIGS. 20 and 21. The method also includes at step 230 defining functional block boundaries. At step 240, the magnetic regions are magnetized. Although the magnetization step 240 is shown in FIG. 12 to occur after step 230, the magnetization step 240 may be performed prior to step 230, provided the process temperatures and magnetic fields are not high enough in step 230 to disturb the orientation of the magnetic moment. At step 250, the blocks are dispersed in solution for later assembly.

For the exemplary embodiment shown in FIG. 13, the magnetic region formation step 220 includes at step 222 forming an un-patterned magnetic film 34 on the host substrate 42 and at step 224 patterning the magnetic film to form the magnetic regions 14. The un-patterned magnetic film 34 can be formed, for example, by sputtering the film 34 on the substrate 42, and the patterning can be performed, for example, using lithographic techniques. These examples are illustrative, and the invention encompasses all techniques for forming and patterning magnetic films.

FIGS. 13-16 illustrate various embodiments of an exemplary method for forming functional blocks 10 using silicon on oxide (SOI) substrates. For the exemplary embodiment shown in FIG. 13, the host substrate 42 comprises a semiconductor layer 44, an oxide layer 32 disposed under the semiconductor layer, and a support semiconductor layer 46 disposed under the oxide layer 32, where the oxide layer 32 is a buried oxide layer 32. In one non-limiting example, the semiconductor layer 44 and the support semiconductor layer 46 comprise silicon, the oxide layer 32 comprises silicon dioxide ($SiO_2$), and the substrate 42 comprises a silicon-on-oxide (SOI) structure 42. For the exemplary embodiment depicted in FIG. 13, the forming magnetic regions step 220 includes at sub-step 222 depositing a magnetic multilayer stack 34, at sub-step 224 depositing and patterning a resist layer 54 (for example, photoresist) on the magnetic film 34 and at sub-step 226 etching the magnetic film stack and removing the resist layer 54 to create patterned magnetic regions 14.

Although not expressly shown in FIGS. 11-16, the method may optionally include forming a protective layer 22 over the host substrate 42 between steps 200 and 210. Example materials for the protective layer are described above. In one example, a $Si_3N_4$ protective layer 22 is deposited using chemical vapor deposition.

Figure 14:
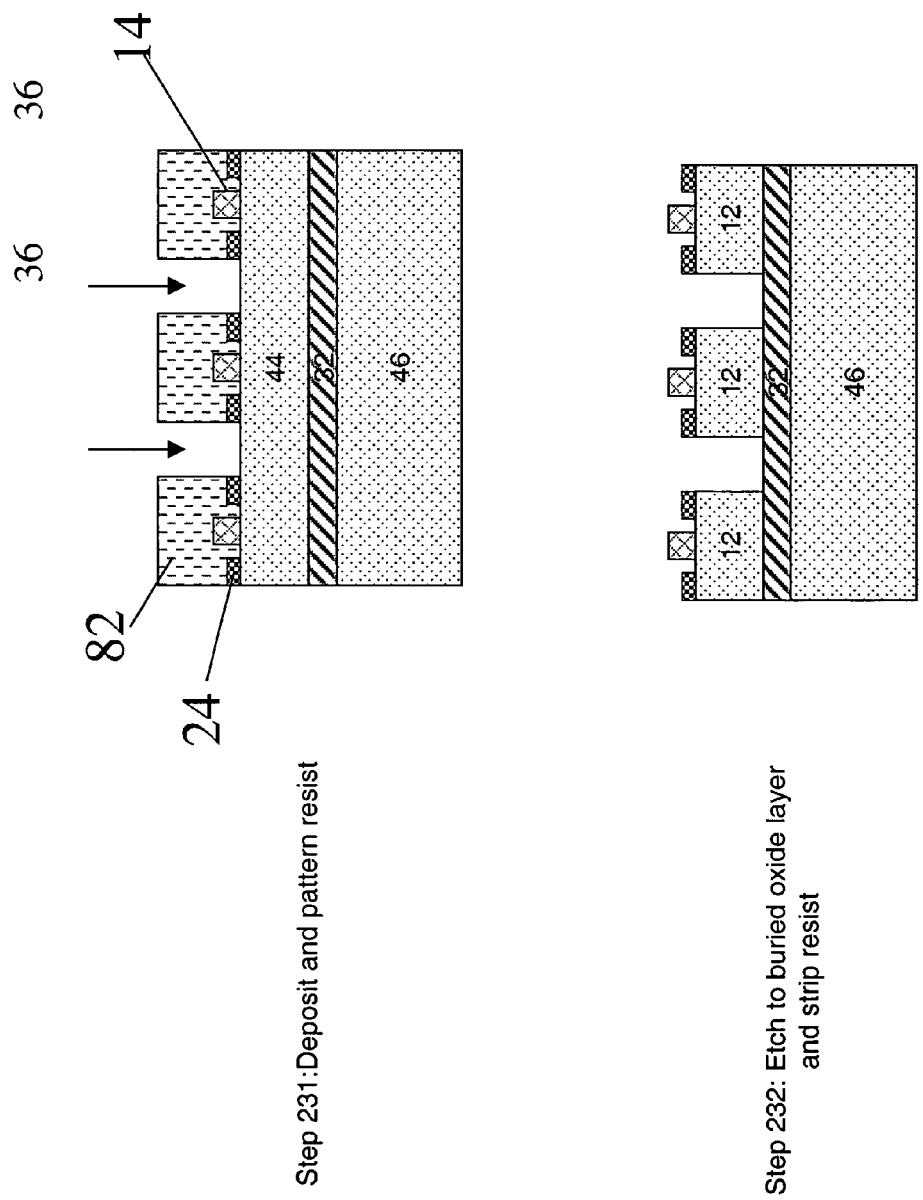
FIG. 14 illustrates exemplary process steps for defining the functional blocks.
Figure 15:
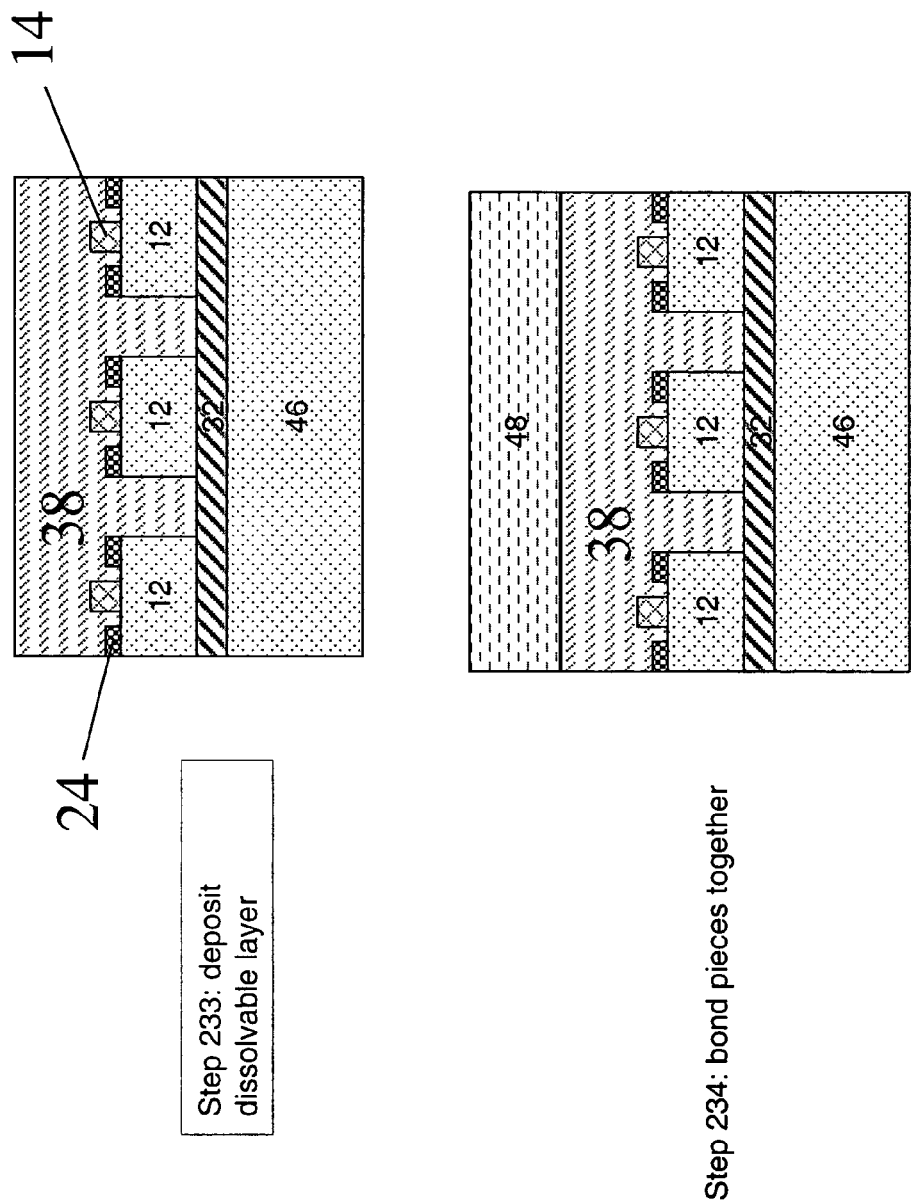
FIG. 15 illustrates additional exemplary process steps for defining the functional blocks.

As discussed above with reference to FIG. 12, the method includes at step 230 defining the functional block boundary. For the exemplary SOI embodiment illustrated by FIG. 14, the method further includes at sub-step 231 depositing and patterning resist layer 82. The illustrated method further includes at sub-step 232 selectively etching the semiconductor layer 44 down to the oxide layer 32 using suitable etching processes. Non-limiting examples of etching techniques include dry etching processes, such as deep-trench ion etching, and wet chemical etching, such as hot KOH etching. As indicated in FIG. 14, elements 12 will be formed by the patterning of semiconductor layer 44. As indicated, for example, in FIG. 15, the exemplary method further includes at sub-step 233 the deposition of dissolvable layer 38 between, and on top of, the functional blocks. An example of a dissolvable layer 38 includes a protective coating marked under the tradename Protek™ B1-18, which is commercially available from Brewer Science. The exemplary method further includes at sub-step 234, bonding the patterned SOI wafer 42 to a bonding substrate (or cap) 48 via the dissolvable layer 38. Using Protek™ B1-18, this can be accomplished by pressing the two wafers together with pressures of approximately 50 PSI at temperatures of approximately 205 C for several minutes. As shown, for example, in FIG. 16, the exemplary method further includes at sub-step 235 removal of the support layer 46. In one non-limiting example, the support semiconductor layer 46 comprises Silicon and is etched in a bath containing hot KOH. KOH preferentially etches Silicon relative to $SiO_2$. The exemplary method illustrated by FIG. 16 further includes at sub-step 236, etching the buried oxide layer using a suitable etching agent, one non-limiting example of which is buffered hydrofluoric acid.

As discussed above with reference to FIG. 12, the method further includes at step 240 aligning the magnetic regions 14. As one non-limiting example, the bonded SOI wafer assembly comprising 42 and 48 can be inserted in a magnetic field aligned perpendicular to the plane of the SOI wafer assembly and a magnitude significantly above the coercive field (approximately 600 Oe for the example shown in FIG. 18). In this magnetic field, all magnetic moments will be aligned parallel to the magnetic field direction. By decreasing the magnitude of the applied magnetic field below the coercive field before removing the bonded wafer assembly, the magnetic moments will be aligned approximately perpendicular to the plane of the bonded wafer assembly in a direction parallel to the previous applied magnetic field, even in zero applied field.

As discussed above with reference to FIG. 12, the method includes at step 250, dispersing the functional blocks 10 in solution. The functional blocks 10 comprise a respective group of at least one element 12 and at least one of the magnetized magnetic regions 14. As an exemplary embodiment, using Protek™ as a dissolvable layer, the functional blocks can be dispersed, by submerging the bonded wafer in a solvent, such as acetone. The functional blocks may optionally be filtered and transferred to other solutions such as methanol or DI-$H_2O$, for example using standard filtration techniques.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A functional block for magnetic self assembly, the functional block comprising:
   at least one element; and
   a patterned magnetic film comprising at least one magnetic region permanently attached to said element, wherein said patterned magnetic film is characterized by a coercivity ($H_c$) of at least about ten Oersteads (Oe),
   wherein the functional block is configured for magnetic self assembly to an article comprising:
   a substrate, and
   a substrate patterned magnetic film disposed on the substrate defining at least one receptor site for receiving the functional block.

2. The functional block of claim 1, wherein said element has a connecting surface, and wherein said at least one magnetic region is configured to exhibit a magnetic moment ($\mu$) that is oriented in a range of plus or minus forty-five degrees from a surface normal for said connecting surface.

3. The functional block of claim 2, wherein said patterned magnetic film is configured as a dipole and comprises a material with a perpendicular magnetic anisotropy.

4. The functional block of claim 2, wherein said element has a free surface, and wherein a magnitude of the magnetic moment is selected such that the functional block is not configured to agglomerate to another functional block at the free surface.

5. The functional block of claim 1, wherein said at least one magnetic region is disposed in an interior of said element.

6. The functional block of claim 1, further comprising at least one electrical contact for each of said elements.

7. The functional block of claim 6, wherein said at least one electrical contact is configured to mechanically fasten said functional block to an article after assembly of said functional block to the article.

8. The functional block of claim 1, further comprising an activated adhesive attached to said element and configured to fasten said functional block to the article after assembly of said functional block to the article and upon activation.

9. The functional block of claim 1, wherein at least one of said at least one element is selected from the group consisting of a semiconductor device, a passive element, a photonic bandgap element, a luminescent material, a sensor, a microelectrical mechanical system (MEMS), an energy harvesting device and combinations thereof.

10. The functional block of claim 2, wherein the magnetic moment ($\mu$) is oriented in a range of plus or minus twenty degrees from the surface normal for said connecting surface.

11. The functional block of claim 10, wherein the magnetic moment ($\mu$) is oriented in a range of plus or minus ten degrees from the surface normal for said connecting surface.

12. The functional block of claim 1, wherein the coercivity ($H_c$) is at least about one hundred Oe.

13. The functional block of claim 12, wherein the coercivity ($H_c$) is at least about one thousand (1000) Oe.

14. The functional block of claim 5, wherein said element is characterized by a thickness $t_c$, and wherein a gap between said magnetic region and a perimeter of said element is at least about 0.1 $t_c$.

15. The functional block of claim 14, the gap between said magnetic region and a perimeter of said element is at least about 0.25 $t_c$.

16. The functional block of claim 15, the gap between said magnetic region and a perimeter of said element is at least about 0.4 $t_c$.

17. The functional block of claim 1, wherein said magnetic film has a footprint, which is curved.

18. The functional block of claim 1, wherein said magnetic film (14) has a footprint, which is polygonal.

19. The functional block of claim 1, wherein said element has a connecting surface, which is curved.

20. The functional block of claim 1, wherein said element has a connecting surface, which is flat.

21. The functional block of claim 6, wherein said magnetic region is circular, and wherein said at least one electrical contact is formed as a ring centered on said magnetic region.

22. The functional block of claim 1, further comprising a protective layer configured to protect said functional block.

23. The functional block of claim 1, wherein said magnetic region is not rotationally symmetric.

24. The functional block of claim 9, wherein said element comprises a semiconductor device selected from the group consisting of transistors, diodes, logic gates, amplifiers and memory circuits.

25. The functional block of claim 9, wherein said element comprises a passive element selected from the group consisting of resistors, capacitors, inductors, and diodes.

26. A functional block for magnetic self assembly, the functional block comprising:
   at least one element; and
   a patterned magnetic film comprising a plurality of magnetic regions permanently attached to said element,
   wherein the functional block is configured for magnetic self assembly to an article comprising:
   a substrate, and
   a substrate patterned magnetic film disposed on the substrate defining at least one receptor site for receiving the functional block.

27. The functional block of claim 26, wherein said magnetic regions are arranged in a quadrupole configuration.

28. The functional block of claim 27, wherein said patterned magnetic film comprises a material with a perpendicular magnetic anisotropy.

29. The functional block of claim 26, wherein said magnetic regions are arranged in a rotationally asymmetric configuration.

30. A functional block for magnetic self assembly, the functional block comprising:
   at least one element having a connecting surface; and
      a patterned magnetic film permanently attached to said element and comprising at least one magnetic region,
   wherein said at least one magnetic region is configured to exhibit a magnetic moment ($\mu$) that is oriented in a range of plus or minus forty-five degrees from a surface normal for said connecting surface, and wherein said at least one magnetic region is characterized by a coercivity ($H_c$) of at least about ten Oersteads (Oe), and
   wherein the functional block is configured for magnetic self assembly to an article comprising:
   a substrate, and
   a substrate patterned magnetic film disposed on the substrate defining at least one receptor site for receiving the functional block.

31. The functional block of claim 30, wherein the magnetic moment ($\mu$) is oriented in a range of plus or minus twenty degrees from the surface normal for said connecting surface.

32. The functional block of claim 30, wherein said at least one magnetic region is disposed in an interior of said element, wherein said element is characterized by a thickness $t_c$, and wherein a gap between said magnetic region and a perimeter of said element is at least about 0.25 $t_c$.

33. The functional block of claim 30, wherein said patterned magnetic film comprises a material with a perpendicular magnetic anisotropy.

34. The functional block of claim 30, wherein said element comprises a semiconductor-based element, said functional block further comprising:
   at least one electrical contact for said element; and
   a protective layer configured to protect said element.

35. The functional block of claim 34, further comprising an oxide layer formed on a free surface of said element.

36. The functional block of claim 35, wherein said semiconductor-based element comprises a silicon-based element, and wherein said oxide layer comprises silicon dioxide ($SiO_2$).

37. A wafer comprising:
   a host substrate comprising a plurality of elements, wherein the elements are selected from the group consisting of semiconductor devices, passive elements, photonic bandgap elements, luminescent elements, sensors, micro-electrical mechanical systems (MEMSs), energy harvesting devices and combinations thereof; and
   a patterned magnetic film permanently attached to said elements and comprising a plurality of magnetic regions, wherein said magnetic regions are permanently attached to respective ones of said elements, and wherein said patterned magnetic film is characterized by a coercivity ($H_c$) of at least about ten Oersteads (Oe).

38. The wafer of claim 37, wherein said host substrate comprises a semiconductor, said wafer further comprising:
   a plurality of electrical contacts for said elements; and
   a protective layer disposed over said elements.

39. The wafer of claim 37, wherein said host substrate comprises a semiconductor layer and an oxide layer disposed under said semiconductor layer.

40. The wafer of claim 37, wherein said patterned magnetic film comprises a material with a perpendicular magnetic anisotropy.

41. The functional block of claim 36, wherein a thickness of said element is in a range of about 0.1 micron to about 100 microns.

42. The wafer of claim 39, wherein said host substrate further comprises a support semiconductor layer disposed under said oxide layer, and wherein said oxide layer is a buried oxide layer.

43. The wafer of claim 42, wherein said semiconductor layer and said support semiconductor layer comprise silicon, wherein said oxide layer comprises silicon dioxide ($SiO_2$), and wherein said substrate comprises a silicon on oxide (SOI) structure.

* * * * *

UNITED STATES PATENT AND TRADEMARK OFFICE
CERTIFICATE OF CORRECTION

| | | |
|---|---|---|
| PATENT NO. | : 8,022,416 B2 | Page 1 of 1 |
| APPLICATION NO. | : 11/254096 | |
| DATED | : September 20, 2011 | |
| INVENTOR(S) | : Huber et al. | |

It is certified that error appears in the above-identified patent and that said Letters Patent is hereby corrected as shown below:

In Column 6, Line 36, delete "(an hence" and insert -- (and hence --, therefor.

In Column 13, Line 62, in Claim 14, delete "$t_c$," and insert -- $t_e$, --, therefor.

In Column 13, Line 64, in Claim 14, delete "$t_c$." and insert -- $t_e$. --, therefor.

In Column 13, Line 65, in Claim 15, delete "the gap" and insert -- wherein the gap --, therefor.

In Column 13, Line 67, in Claim 15, delete "$t_c$." and insert -- $t_e$. --, therefor.

In Column 14, Line 1, in Claim 16, delete "the gap" and insert -- wherein the gap --, therefor.

In Column 14, Line 3, in Claim 16, delete "$t_c$." and insert -- $t_e$. --, therefor.

In Column 14, Line 67, in Claim 32, delete "$t_c$," and insert -- $t_e$, --, therefor.

In Column 15, Line 2, in Claim 32, delete "$t_c$." and insert -- $t_e$. --, therefor.

Signed and Sealed this
Seventh Day of February, 2012

David J. Kappos
*Director of the United States Patent and Trademark Office*